United States Patent [19]

Howard

[11] Patent Number: 5,459,691

[45] Date of Patent: Oct. 17, 1995

[54] MEMORY CIRCUIT

[75] Inventor: David W. Howard, Cherry Hinton, United Kingdom

[73] Assignee: Advanced RISC Machines Limited, Cambridge, United Kingdom

[21] Appl. No.: 303,229

[22] Filed: Sep. 8, 1994

[30] Foreign Application Priority Data

Oct. 13, 1993 [GB] United Kingdom ............... 9321100

[51] Int. Cl.$^6$ ............................................. G11C 13/00
[52] U.S. Cl. ......................... 365/201; 365/202; 365/210
[58] Field of Search ................ 365/189.01, 189.04, 365/201, 202, 230.01, 210, 49, 230.08, 189.05

[56] References Cited

U.S. PATENT DOCUMENTS 5,130,945  7/1992  Hamamoto et al. ................. 365/45
5,148,397  9/1992  Kokbun ................................ 365/185

Primary Examiner—Terrell W. Fears
Attorney, Agent, or Firm—Albert C. Smith

[57] ABSTRACT

A memory circuit, in which test data are compared with stored data, comprises a plurality of memory cells each having two complementary data outputs indicative of a respective stored bit of the stored data. The two complementary outputs are selectively interchanged, in response to a respective test bit of the test data. An output signal is then generated (e.g. by a sense amplifier) in response to the relative polarities of the two complementary data outputs. The output signal is indicative of whether the stored bit is equal to the test bit. Where a multi-bit word is stored in a plurality of the memory cells, the output signals generated by a comparison of each stored bit of the multi-bit word and respective bits of the test data are combined by, for example, an AND gate. The output of the AND gate indicates whether the test data matches the stored multi-bit word.

9 Claims, 4 Drawing Sheets

MEMORY CIRCUIT

BACKGROUND OF THE INVENTION

1. Field of the Invention

This invention relates to memory circuits.

2. Description of the Prior Art

It is known to use a cache memory to improve the performance of a central processing unit (CPU) in a data processing system. A cache memory is a relatively small, high speed random access memory (RAM) which is used to store data which are frequently required by the CPU. Typically, the cache memory is directly accessed by the CPU (rather than via, for example, an external memory management unit (MMU)) and is situated physically close to the CPU in order to reduce the signal propagation time between the CPU and the cache memory. These features mean that data can be stored in or retrieved from the cache memory very quickly.

Since the cache memory stores only a small subset of the data being handled by the data processing system, it is necessary that the CPU knows whether to retrieve a particular data item from the cache memory or from a (slower) system memory. Accordingly, one previously proposed design of a cache memory comprises a tag memory and an associated data memory. The tag memory is used to store system addresses relating to items of data currently held in the data memory. When the CPU requires access to a data item, a system address associated with that data item is compared with the addresses held in the tag memory. If the address of the current data item matches an address held in the tag memory then the CPU can access that data item in the data memory.

FIG. 1 of the accompanying drawings is a schematic diagram of a previously proposed tag memory, which typically forms part of an integrated circuit. In many cases, the tag memory and associated data memory are implemented with the CPU in a common integrated circuit.

In FIG. 1, an array of memory cells 10 is arranged to provide storage of n data words, each having m bits. Each data word represents a system address of a data item stored in an associated data memory, and is compared with a test address 15 supplied by the CPU. The memory cells and associated circuitry for storing and retrieving one of the n data words are shown in more detail and are indicated as 20.

Each memory cell has two complementary output bitlines, referred to as 'bit' and 'nbit' (not bit), which ape connected to respective non-inverting and inverting inputs of a corresponding differential sense amplifier 30. Before a read operation is initiated, both bitlines are in a pre-charged (high) state. As the read operation takes place, either the 'bit' or the 'nbit' bitline is pulled low. The sense amplifier is used to increase the speed of reading data from the memory, by sensing which of the bitlines is being pulled low and quickly generating a binary output in response to that detection.

The outputs of the sense amplifiers 30 therefore represents the m-bit word stored in the corresponding m memory cells 10, and are supplied to respective first inputs of m two-input exclusive NOR (EX-NOR) gates 40. The second input of each EX-NOR gate is connected to a respective bit of the test address 15. The truth table for the exclusive NOR operation is as follows:

| Sense amplifier output | test address bit | EX-NOR output |
| --- | --- | --- |
| 0 | 0 | 1 |
| 0 | 1 | 0 |
| 1 | 0 | 0 |
| 1 | 1 | 1 |

The above truth table shows that the output of each EX-NOR gate is 1 (true) only if the respective bit of the test address 15 is equal to the output of the respective sense amplifier 30.

The outputs of all of the EX-NOR gates 40 are combined by an m-input AND gate 50 to generate a 'match' output 60. The match output 60 is equal to 1 (true) only if all of the inputs of the m-input AND gate are also equal to 1 (true). Accordingly, for each m-bit word, the respective match output 60 indicates whether the test address 15 is equal to the address stored as that m-bit word in the tag memory. The match output is then used to control access to the data memory.

Since the aim of a cache memory is to provide the CPU with a very fast access memory, it is important that the access time of the cache memory (and in particular the tag memory) is as low as possible. However, in previously proposed tag memories employing exclusive NOR gates, the exclusive NOR gates can contribute significantly to the total access time of the tag memory. For example, using current technology a typical access time for a tag memory of the type shown in FIG. 1 is about 10 nanoseconds (nS), of which about 2 nS represents the delay imposed by the exclusive NOR gates 40.

In addition, the exclusive NOR function is an awkward function to implement as part of an integrated circuit tag memory. In particular, an exclusive NOR gate generally requires either two gate delays or alternatively both true and complement outputs from a single sense amplifier.

It is also a constant aim in the field of integrated circuit design to reduce the area of an integrated circuit substrate which is required to implement the functions of the integrated circuit.

SUMMARY OF THE INVENTION

It is an object of the invention to provide a memory circuit having an improved access time and/or requiring less area on an integrated circuit substrate.

This invention provides a memory circuit in which input test data are compared with stored data, the memory circuit comprising: a plurality of memory cells, each memory cell being operable to generate two complementary data output signals indicative of a respective stored bit of the stored data; switching means, responsive to a respective test bit of the test data, for selectively interchanging the two complementary data output signals, the switching means generating two intermediate data output signals; and output means, responsive to the relative polarities of the two intermediate data output signals, for generating a comparison signal indicative of whether the stored bit is equal to the test bit.

The invention addresses the problems described above by providing a memory circuit in which a test for equality between a test bit and a stored bit is performed by selectively interchanging the two complementary output signals (e.g. 'bit' and 'nbit') indicative of the stored bit, before those signals are supplied to an output means such as a sense amplifier. This has the effect that the sense amplifier output will have a particular polarity (e.g. true) when the test bit and the stored bit are the same, and the other polarity (e.g. false) when the test bit and the stored bit are not the same.

The skilled man will appreciate that the complementary output signals need not be complementary except during an access cycle in which the data bit stored in a memory cell is accessed. For example, before the memory cell is accessed, the output signals may both be in a pre-charged (high) state, so that as the access operation takes place, one of the two output signals is pulled low. Alternatively, the output signals could both start from a low state, or the complementary nature of the output signals could indeed be maintained all of the time.

Accordingly, the invention avoids the need for slow and awkward exclusive NOR gates in, for example, a cache tag memory, and instead employs a simple switching circuit to interchange the two complementary output signals. Using current CMOS technology, such a switching circuit could be implemented using four transistors, and with a propagation delay of about one quarter of that for the exclusive NOR circuits described above.

Although the output means could simply detect the state of a predetermined one of the intermediate data output signals, it is preferred, for improved speed of operation, that the output means comprises a sense amplifier having inverting and non-inverting inputs for receiving the two intermediate data output signals.

Preferably the memory circuit comprises an array of memory cells for storing a plurality of data words.

For use as, for example, a cache tag RAM, it is preferred that the test data comprises a test word; and the memory circuit comprises means for combining the comparison signals resulting from a comparison of each bit of the test word with a respective bit of a stored data word, to generate a match signal indicative of whether the test word is equal to that stored data word. The test word and the stored data words could represent, for example, the address of a data item stored in an associated cache data RAM.

In an advantageously simple embodiment, the means for combining comprises an AND gate.

It is preferred that the switching means comprises a plurality of switching transistors operable to transfer the two complementary data output signals from a memory cell to the output means via a selected one of a plurality of data paths.

Viewed from a second aspect this invention provides a cache memory comprising a memory circuit as defined above; and a cache data memory for storing cache data; in which data stored in the memory circuit are indicative of at least a part of a memory address of cache data stored in the cache data memory.

Viewed from a third aspect this invention provides data processing apparatus comprising: a cache memory as defined above; and a central processing unit operable to access cache data stored in the cache memory.

Viewed from a fourth aspect this invention provides a method of operating a memory circuit in which input test data are compared with stored data, the method comprising the steps of: generating two complementary data output signals indicative of a respective stored bit of the stored data; selectively interchanging the two complementary data output signals to generate two intermediate data output signals, in response to a respective test bit of the test data; and generating a comparison signal indicative of whether the stored bit is equal to the test bit in response to the relative polarities of the two intermediate data output signals.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 2:
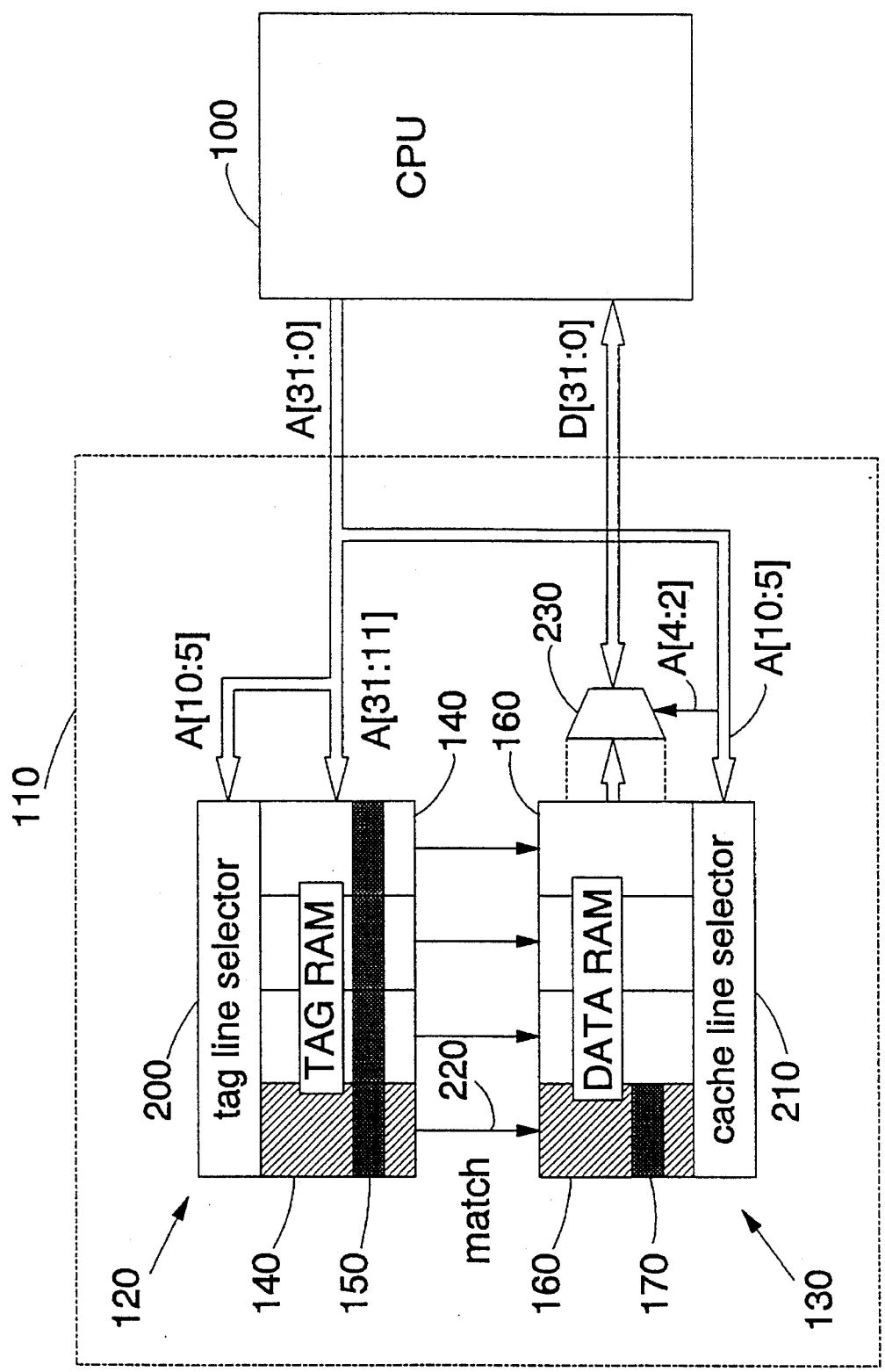
FIG. 2 is a schematic block diagram of a data processing apparatus.

Referring now to FIG. 2, a data processing apparatus comprises a central processing unit (CPU) 100 and a cache memory 110. The CPU 100 and the cache memory 110 may be fabricated as respective parts of a common integrated circuit.

The cache memory 110 comprises a tag RAM 120 and a data RAM 130. The tag RAM comprises four tag units 140, each of which comprises 64 tag lines 150. Similarly, the data RAM comprises a four cache RAMs 160, each having 64 cache lines 170. Each cache line stores eight data words, each comprising 32 bits (four bytes) of data.

When the CPU 100 requires access to data having a particular address, it transmits a 32-bit address signal A[31:0] to the cache memory 110. Data are exchanged between the CPU 100 and the cache memory 110 on a data bus carrying using 32-bit data signals D[31:0].

Of the 32 bits of the address signal, the 5th to 10th bits, i.e. A[10:5] are supplied to a tag line selector 200 forming part of the tag 120 and also to a cache line selector 210 forming part of the data RAM 130. These six address bits specify a particular one of the tag lines 150 and the cache lines 170. In FIG. 2 the selected tag line 150 and cache line 170 are indicated schematically by heavy shading.

The tag lines 150 store 21 bit addresses corresponding to the 11th to 31st bits of a data address. In order to detect whether data corresponding to a particular data address are stored in the data RAM 130, the 11th to 31st bits of the address generated by the CPU 100, i.e. A[31:11], are compared with the content of the currently selected tag line 150 in each of the four tag units 140.

For each tag unit 140, if the contents of the selected tag line in that tag unit 140 are equal to the 21 high order bits A[31:11] of the current address output by the CPU 100, a match signal 220 is set for that tag unit.

As mentioned above, the 5th to 10th bits of the current address output by the CPU 100 are also supplied to the cache line selector 210 which selects a particular cache line 170 (indicated in FIG. 2 by heavy shading) in each of the cache RAMs 160. When a match signal 220 is received from one of the tag units 140, this selects one of the cache RAMs 160. The combination of the selection of a cache RAM 160 by the match signal and the selection of a cache line 170 by the cache line selector 210 identifies a single cache line 170 in a single cache RAM 160. The eight data words stored in that cache line are supplied to a multiplexer 230, which selects one of the data words for access in dependence on the 2nd to 4th bits (i.e. A[4:2]) of the address signal output by the CPU 100. Each output data word is a 32-bit data word containing four bytes of data. Generally the entire 32-bit word is accessed (e.g. during fetching of 32-bit instructions). However, if access to a particular byte is required, the byte to be addressed is indicated by the 0th and 1st bits A[1:0] of the data address.

The addressing function provided by the various portions of the address signal A[31:0] are summarised in the following table:

| Address bits | Function |
| --- | --- |
| A [31:11] | compared with the contents of selected tag line in each tag unit |
| A [10:5] | used to select a tag line in each tag unit and cache RAM |
| A [4:2] | control multiplexer 230 to select one of eight data words |
| A [1:0] | selects a single byte from a selected 32-bit data word |

Figure 3:
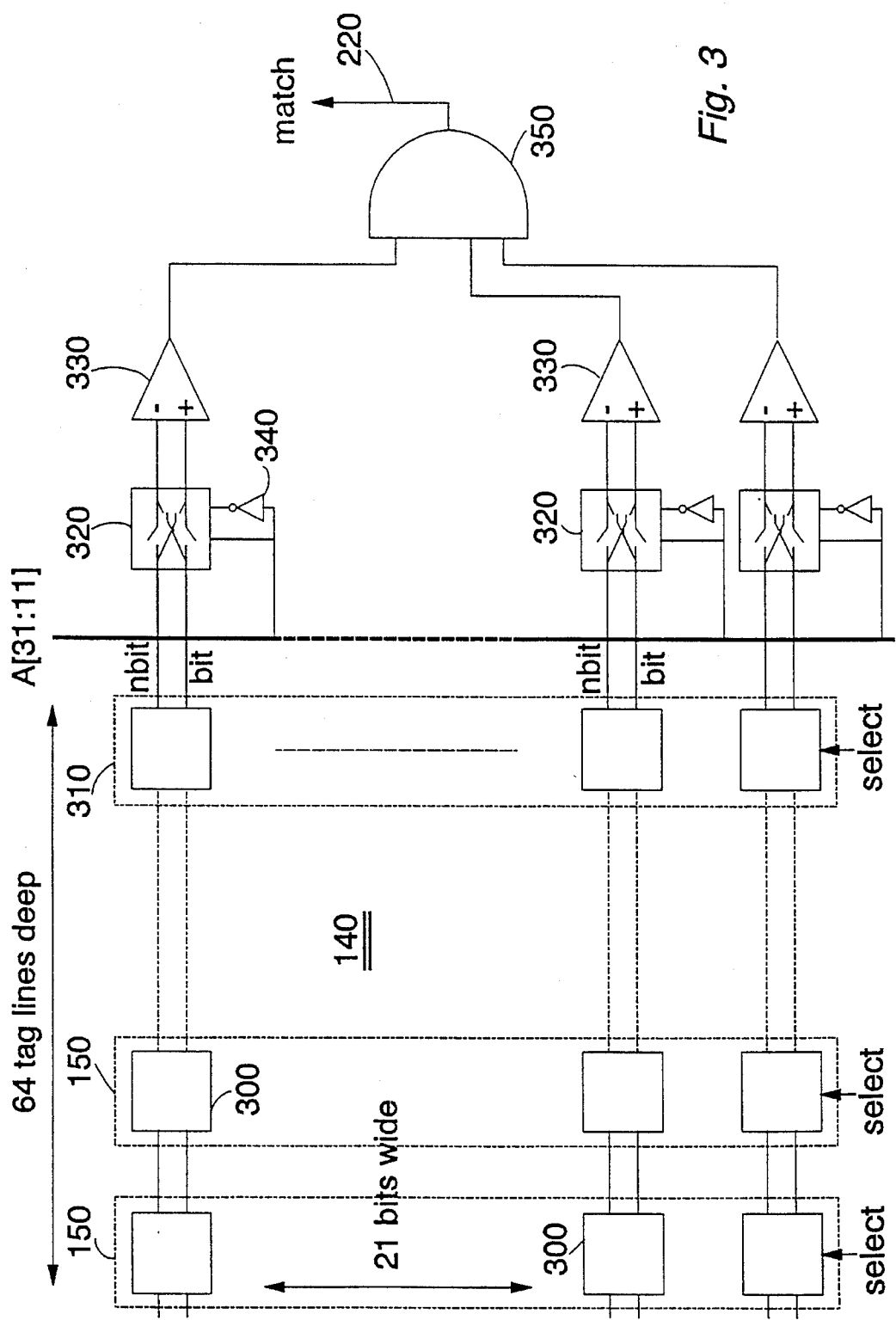
FIG. 3 is a schematic diagram of a cache tag memory according to an embodiment of the present invention.

FIG. 3 is a schematic diagram of a tag unit 140 comprising a plurality of memory cells 300 arranged to provide 64 tag lines 150, each being 21 bits wide.

The tag lines 150 receive respective select signals from the tag line selector 200 (not shown in FIG. 3). In the example shown in FIG. 3, a particular tag line 310 has been selected.

Each memory cell 300 generates two complementary outputs, referred to as 'bit' and 'nbit'. Before a read operation is initiated, both of the 'bit' and 'nbit' outputs are held high. When a memory cell is read, if that memory cell is currently storing a logical 1 then its 'bit' output remains high and its 'nbit' output is driven low. Conversely, if that memory cell is currently storing a logical 0, then its 'bit' output is driven low and its 'nbit' output remains high.

It will therefore be clear that in this embodiment, the bitlines 'bit' and 'nbit' are complementary during access of that memory cell, even though they are both in the same logical state (high) between access operations. In other embodiments, the bitlines could be complementary all of the time.

The output of each of the memory cells 300 in the selected tag line 310 is passed, via a respective switch unit 320, to a respective sense amplifier 330. Each switch unit 320 receives a respective bit of the test address A[31:11] to be compared with the contents of the tag line 310, along with the complement of that address bit generated by a NOT gate 340.

The sense amplifiers are used to increase the speed of reading data from the memory cells 300, by sensing which of the sense amplifier inputs is being pulled low and quickly generating a binary output in response to that detection.

Each of the switch units 320 is operable, under the control of the respective address bit and its complement to exchange the two output signals ('bit' and 'nbit') generated by that memory cell 300. This operation of the switch units 320 will be described further with reference to FIG. 4.

Figure 4:
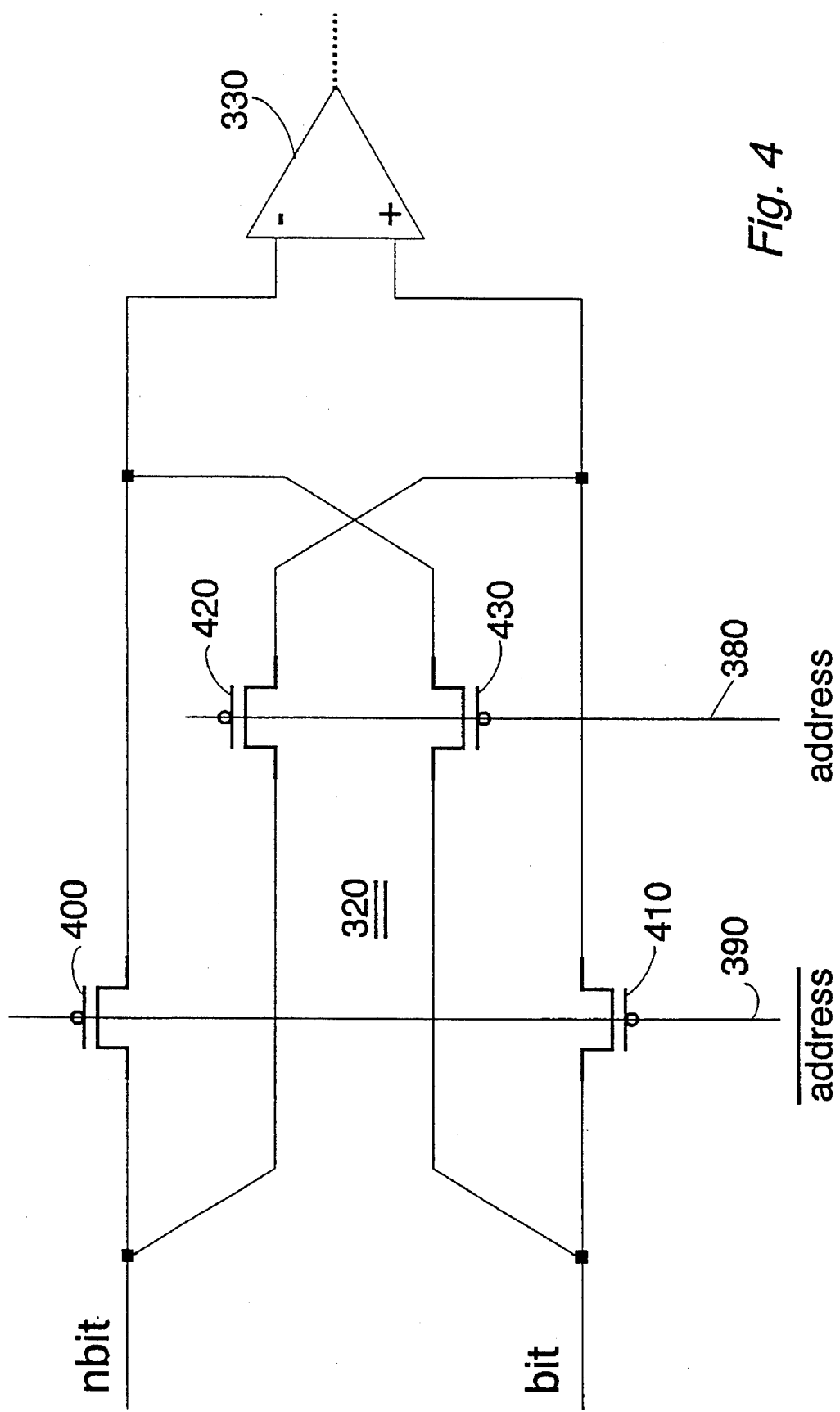
FIG. 4 is a schematic diagram of a switch unit.

FIG. 4 is a schematic diagram of a switch unit 320 which receives a 1-bit address signal 380 (and its complement 390), representing 1 bit of the test address. The switch unit 320 comprises four p-channel transistors 400, 410, 420 and 430. A p-channel transistor is switched on by the presence of a logical zero at the transistor's gate.

In operation, if the address bit 380 is high (and therefore its complement 390 is low) then the transistors 400 and 410 will be switched on and the transistors 420 and 430 switched off. This means that the 'nbit' signal from the memory cell 300 will be supplied directly to the inverting input of the sense amplifier 330 and the 'bit' signal from the memory cell 300 will be supplied to the non-inverting input of the sense amplifier 330. The result of this is that if the memory cell 300 stores a logical 1 and the address bit 380 is a logical 1, then the output of the sense amplifier 330 is true (logical 1).

If, however, the address bit 380 is a logical 0 (and therefore its complement 390 is a logical 1) then the transistors 400 and 410 are turned off and the transistors 420 and 430 are turned on. This has the effect of routing the 'nbit' signal to the non-inverting input of the sense amplifier 330 and routing the 'bit' signal to the inverting input of the sense amplifier 330. Accordingly, when the address bit is a logical 0, the sense amplifier 330 has a true (logical 1) output if 'nbit' is high and 'bit' is low, i.e. if that memory cell stored a logical 0.

The various combinations of the data stored by the memory cell 300, the signals 'bit' and 'nbit', and the address bit 380 and its complement 390 are shown in the following table, along with the output of the sense amplifier 330.

| cell data | bit | nbit | address | not address | sense + | sense − | sense output |
| --- | --- | --- | --- | --- | --- | --- | --- |
| 0 | 0 | 1 | 0 | 1 | nbit (1) | bit (0) | 1 |
| 1 | 1 | 0 | 0 | 1 | nbit (0) | bit (1) | 0 |
| 0 | 0 | 1 | 1 | 0 | bit (0) | nbit (1) | 0 |
| 1 | 1 | 0 | 1 | 0 | bit (1) | nbit (0) | 1 |

The above table shows that each sense amplifier 330 will output a logical true (1) value only if the output bit of that memory cell 300 is equal to the respective bit of the test address. This means that the outputs of the sense amplifiers 330 can be combined directly by a 21 input AND gate 350 to generate the match signal 220. The match signal 220 is equal to 1 (true) only if all of the inputs of the 21-input AND gate 350 are also equal to 1 (true). Accordingly, the match signal 220 indicates whether the test address A[31:11] is equal to the address stored as the 21-bit word in that tag line.

Figure 1:
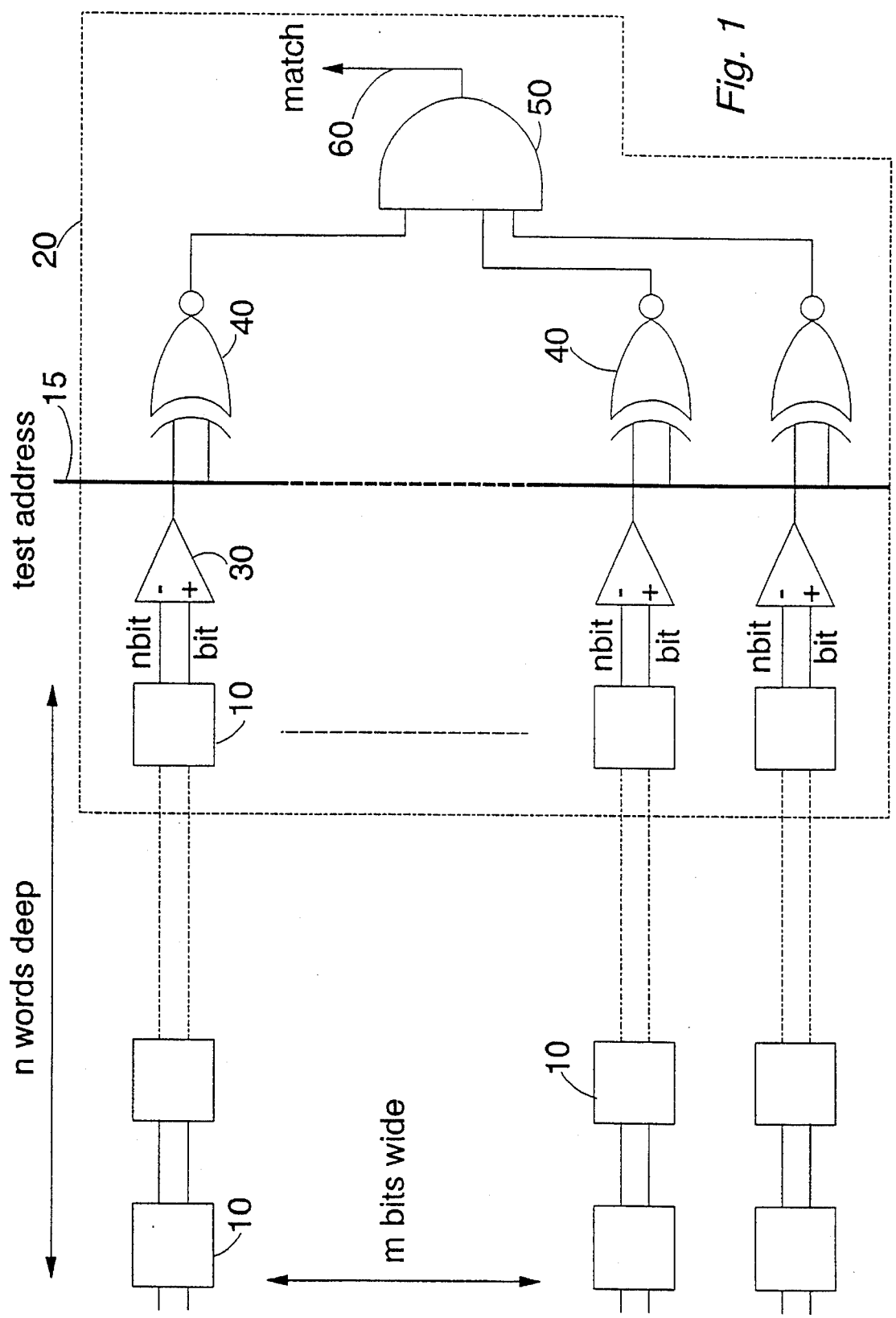
FIG. 1 is a schematic diagram of a previously proposed cache tag memory.

By comparing FIGS. 1 and 3, it will be seen that the function of the exclusive NOR gates 40 of FIG. 1 is no longer required; instead, a four transistor switch unit 320 and a NOT gate 340 are used in connection with each memory cell 300. Not only is the operation of the switch unit 320 in the present embodiment faster than that of an exclusive NOR gate in the previously proposed tag memory, it also employs fewer transistors (four) than a typical exclusive NOR gate (generally about ten transistors).

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A memory circuit in which input test data are compared with stored data, said memory circuit comprising:

a plurality of memory cells, each memory cell being operable to generate two complementary data output signals indicative of a respective stored bit of said stored data;

switching means, responsive to a respective test bit of said test data, for selectively interchanging said two complementary data output signals, said switching means generating two intermediate data output signals; and output means, responsive to the relative polarities of said two intermediate data output signals, for generating a comparison signal indicative of whether said stored bit is equal to said test bit.

2. A memory circuit according to claim 1, in which said output means comprises a sense amplifier having inverting and non-inverting inputs for receiving said two intermediate data output signals.

3. A memory circuit according to claim 1, comprising an array of memory cells for storing a plurality of data words.

4. A memory circuit according to claim 3, in which:

said test data comprises a test word; and said memory circuit comprises means for combining said comparison signals resulting from a comparison of each bit of said test word with a respective bit of a stored data word, to generate a match signal indicative of whether said test word is equal to that stored data word.

5. A memory circuit according to claim 4, in which said means for combining comprises an AND gate.

6. A memory circuit according to claim 1, comprising a plurality of data paths for transferring signals from a memory cell to said output means, and in which said switching means comprises a plurality of switching transistors operable to transfer said two complementary data output signals from a memory cell to said output means via a selected one of said plurality of data paths.

7. A cache memory comprising:

a memory circuit according to claim 1; and a cache data memory for storing cache data;

in which data stored in said memory circuit are indicative of at least a part of a memory address of cache data stored in said cache data memory.

8. Data processing apparatus comprising:

a cache memory according to claim 7; and a central processing unit operable to access cache data stored in said cache memory.

9. A method of operating a memory circuit in which input test data are compared with stored data, said method comprising the steps of:

generating two complementary data output signals indicative of a respective stored bit of said stored data;

selectively interchanging said two complementary data output signals to generate two intermediate data output signals, in response to a respective test bit of said test data; and generating a comparison signal indicative of whether said stored bit is equal to said test bit in response to said relative polarities of said two intermediate data output signals.

* * * * *